(12) United States Patent
Wyszynski

(10) Patent No.: US 6,750,713 B1
(45) Date of Patent: Jun. 15, 2004

(54) VARIABLE GAIN AMPLIFIER

(75) Inventor: Adam S. Wyszynski, Little Elm, TX (US)

(73) Assignees: Sharp Corporation, Osaka (JP); Rivlan, Inc., Little Elm, TX (US)

(*) Notice: Subject to any disclaimer, the term of this patent is extended or adjusted under 35 U.S.C. 154(b) by 0 days.

(21) Appl. No.: 10/341,442

(22) Filed: Jan. 14, 2003

(51) Int. Cl.[7] ............................................. H03F 3/45
(52) U.S. Cl. .................... 330/254; 330/285; 330/284
(58) Field of Search ............................ 330/254, 278, 330/285, 297, 284, 296

(56) References Cited

U.S. PATENT DOCUMENTS

| 3,761,832 A | * | 9/1973 | Blattenberger |
| 4,039,981 A | | 8/1977 | Ohashi et al. |
| 5,880,631 A | | 3/1999 | Sahota |
| 5,952,880 A | | 9/1999 | Voorman et al. |

FOREIGN PATENT DOCUMENTS

JP          62105510    *   5/1987

* cited by examiner

*Primary Examiner*—Michael B Shingleton
(74) *Attorney, Agent, or Firm*—Locke Liddell & Sapp LLP

(57) ABSTRACT

A variable gain amplifier includes a voltage divider input stage for receiving a signal to be amplified. A first voltage amplifier is connected in cascade with the voltage divider for amplifying the signal to be amplified. The voltage divider input stage includes a variable impedance circuit having a second voltage amplifier. The second voltage amplifier includes an input and an output. An impedance element is connected between the voltage amplifier input and output. The voltage divider input stage is connected in series to a second impedance element. Each of the voltage amplifiers has its gain controlled by a bias current source.

16 Claims, 3 Drawing Sheets

VARIABLE GAIN AMPLIFIER

TECHNICAL FIELD OF THE INVENTION

The present invention relates to variable gain amplifiers, and more particularly to a variable gain amplifier used in communications devices.

BACKGROUND OF THE INVENTION

In a wireless communications environment, a wireless communications receiver may receive a signal which experiences rapid and wide variations in signal power. In receivers such as are used in wideband digital code division multiple access (CDMA) mobile stations, it Is necessary to control the power of the demodulation signal for proper signal processing. Also, in transmitters such those used in a CDMA mobile station, it is necessary to control the transmit power in order to avoid excessive interference with other mobile stations. The same power control considerations apply to narrow band analog frequency modulation wireless communications system receivers and transmitters.

Mobile communications receivers and transmitters are designed to have a high compression point, low noise injection and low power consumption. These characteristics are important when designing a variable gain amplifier for a communications system in which signals are transmitted and received over a large range of power levels. A receiver should be able to detect information from both a strong signal broadcast by a nearby and powerful transmitter and a weak signal broadcast by a distant and low power transmitter. The extent over which the receiver can detect weak to strong signals is termed its dynamic range. A transmitter should be able to transmit low powered signals to a nearby receiver and high power signals to a distant receiver.

The dynamic range of a receiver is established by its minimum detectible and maximum detectible signal levels. The minimum detectible signal level of a receiver is determined by the receivers noise figure. The minimum transmittal power is set by the transmitters noise figure if the signal level falls near or below the noise floor. A variable gain amplifiers noise figure is in part a function of the noise injection properties and gain of the amplifier.

The maximum detectible signal level of a receiver may be established by the receiver's intermodulation distortion performance. When multiple signals pass through any device, mixing action between the signal occurs because of the nonlinearities of the device. A variable gain amplifier's intermodulation distortion performance is in part a function of its linearity and its gain. In general, the lower the receivers gain, the better the intermodulation distortion performance. This performance is in contrast to the noise figure requirements. Thus, the design of a variable gain amplifier for a receiver with a large dynamic range includes trade offs between intermodulation distortion performance and the noise figure.

Mobile receivers are designed to be compact, light weight and have a long operation lifetime. Because battery voltage is proportional to the number of battery cells, the variable gain amplifier must operate at low supply voltages.

A need has thus arisen for a variable gain amplifier with a high dynamic range, good noise figure and intermodulation distortion performance, as well as having the ability to operate at low power consumption. The variation of the gain due to temperature and precess variation must be minimal.

SUMMARY OF THE INVENTION

In accordance with the present invention, a variable gain amplifier includes a voltage divider input stage for receiving a signal to be amplified. A first voltage amplifier is connected in cascade with the voltage divider for amplifying the signal to be amplified. The voltage divider input stage includes a variable impedance circuit having a second voltage amplifier. The second voltage amplifier includes an input and an output. An impedance element is connected between the voltage amplifier input and output. The voltage divider input stage is connected in series to a second impedance element. Each of the voltage amplifiers has its gain controlled by a bias current source.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
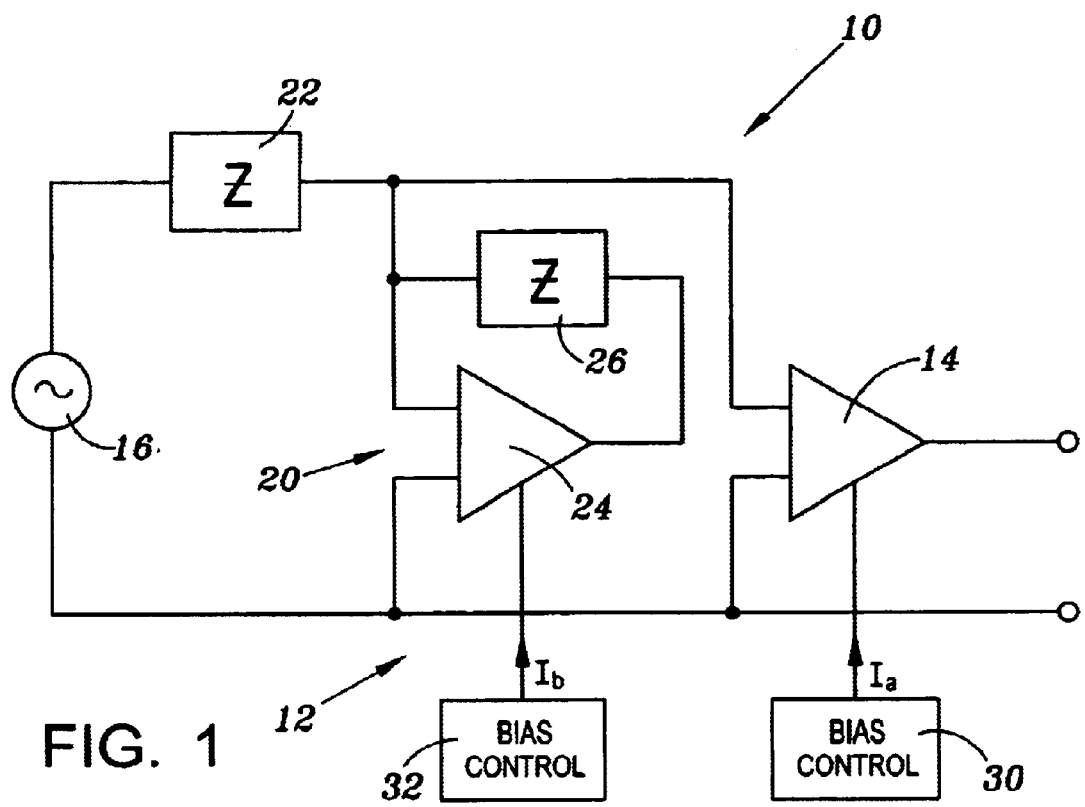
FIG. 1 is a block diagram of the present variable gain amplifier.

Referring to the FIG. 1, a block diagram of the present variable gain amplifier is illustrated and is generally identified by the numeral 10. Variable gain amplifier. (VGA) 10 includes a voltage divider, generally identified by the numeral 12, connected in cascade with a voltage amplifier 14. A voltage 16 is applied to voltage divider 12 and voltage amplifier 14.

Voltage divider 12 uses a voltage drop created by a variable impedance circuit 20 which is connected with an impedance element 22 in series. Circuit 20 includes a voltage amplifier 24 and an impedance element 26 connected between the input and output of amplifier 24. The gain of amplifiers 14 and 24 are controlled by a bias current $l_a$ and $l_b$, respectively translated Into a bias voltage which feeds the amplifying elements in respective amplifiers 14 and 24. Currents $l_a$ and $l_b$ are generated by bias control current sources 30 and 32, respectively.

The amplified elements of amplifiers 14 and 24 may comprise, for example, field effect transistors such that the bias currents $l_a$ and $l_b$ flow through sources and drains of the amplified elements in amplifiers 14 and 24, respectively. The gain of the variable gain amplifier.10 is roughly proportional to the square root of $l_a$ divided $l_b$.

Figure 2:
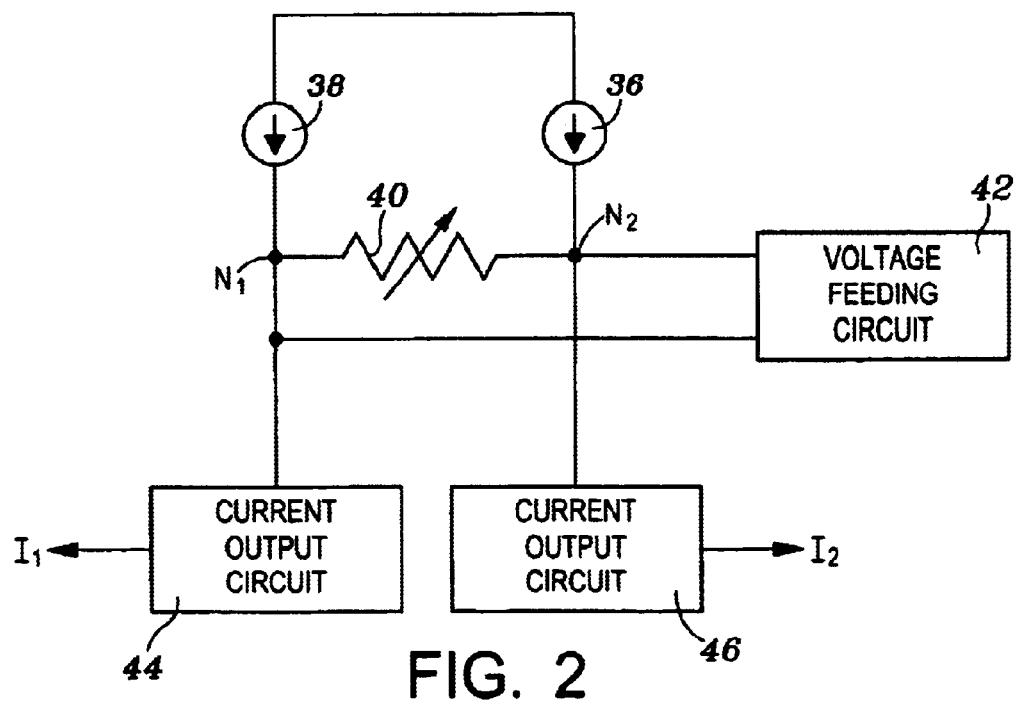
FIG. 2 is a block diagram of the bias control illustrated in FIG. 1.

FIG. 2 illustrates a block diagram of an embodiment of the bias control current sources 30 and 32 of FIG. 1. Two current sources 36 and 38 generate a constant current. A trimable resistor 40 is connected between current sources 36 and 38 at nodes $N_1$ and $N_2$. Connected across resistor 40 is a voltage feeding circuit 42. Connected to node $N_1$ is a current output circuit 44 for generating a current $l_1$. Connected to node $N_2$ is a current output circuit 46 for generating a current $l_2$. The current $l_1$ is equal to the current generated by current source 38 plus the value of the voltage generated by circuit 42 divided by the value of resistor 40. The current generated by circuit 46, $l_2$, is equal to the value of the current generated by current source 36 minus the value of the voltage generated by circuit 42 divided by the value of resistor 40. The bias currents $1_a$ and $1_b$ (FIG. 1) are proportional to the currents 11 and 12, respectively.

Figure 3:
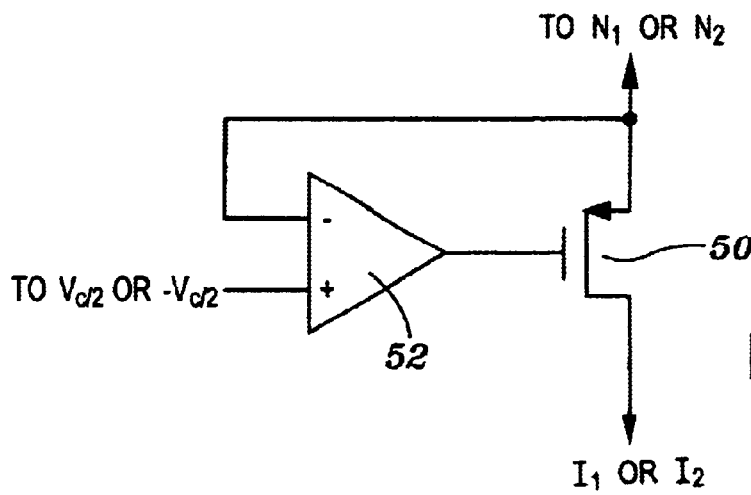
FIG. 3 is a block diagram of the voltage feeding circuit illustrated in FIG. 2.

FIG. 3 illustrates circuitry for an embodiment of voltage feeding circuit 42 and current output circuits 44 and 46 which includes a field effect transistor or bipolar transistor 50 and an operational amplifier 52. A source or an emitter of transistor 50 and the negative input of operational amplifier 52 are connected to the node $N_1$ or node $N_2$. An output of operational amplifier 52 is connected to a gate or base of transistor 50. A positive input of the amplifier 52 is fed with a positive or negative half of the control voltage. The output current $1_1$ or $1_2$ is generated from the drain or collector of transistor 50.

Figure 4:
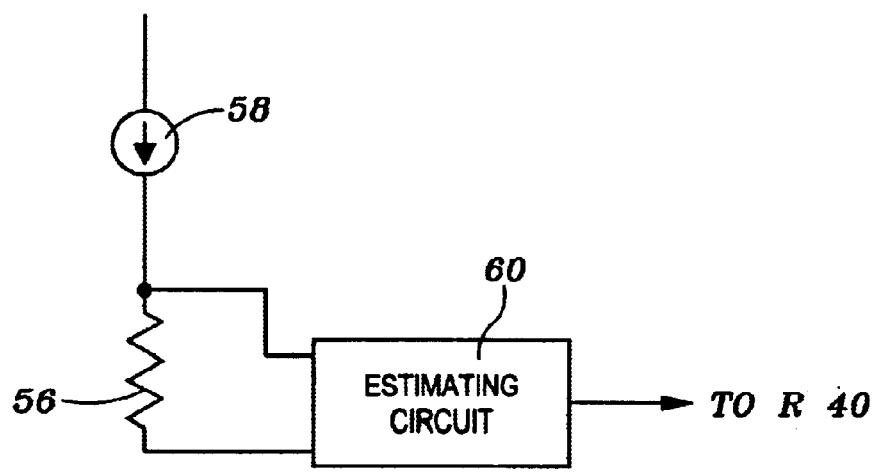
FIG. 4 is a block diagram of a compensation circuit for the resistor shown in FIG. 2.

Resistor 40 (FIG. 2) is compensated for temperature and process variations. As illustrated in FIG. 4, a compensation circuit includes a resistor 56 and a constant current source 58 and an estimating circuit 60. Resistor 56 is disposed in the same environment and structure of resistor 40 and is fed with a current from current source 58. The estimating circuit 60 measures resistance fluctuation of resistor 56 by comparing a voltage drop across resistor 56 with a standard value, and compensates resistor 40 accordingly. Current source 58 generates a current whose temperature coefficient has the same absolute value, but the opposite sign of the temperature coefficient of resistor 40.

Figure 5:
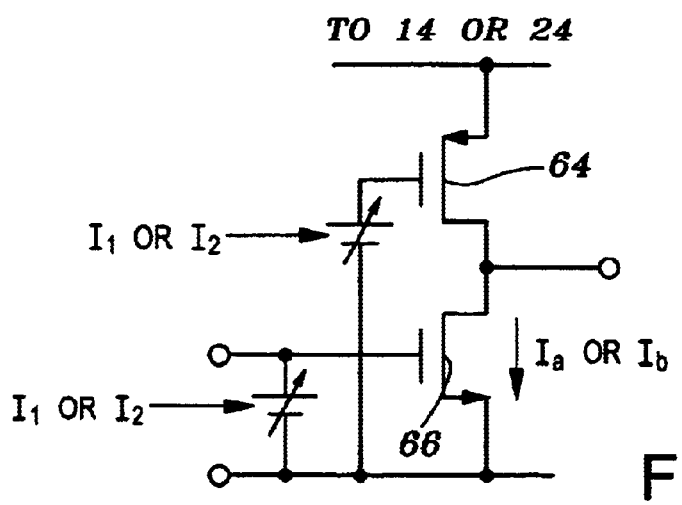
FIGS. 5, 6 and 7 are schematic block diagrams of components of the amplifiers illustrated in FIG. 1.
Figure 6:
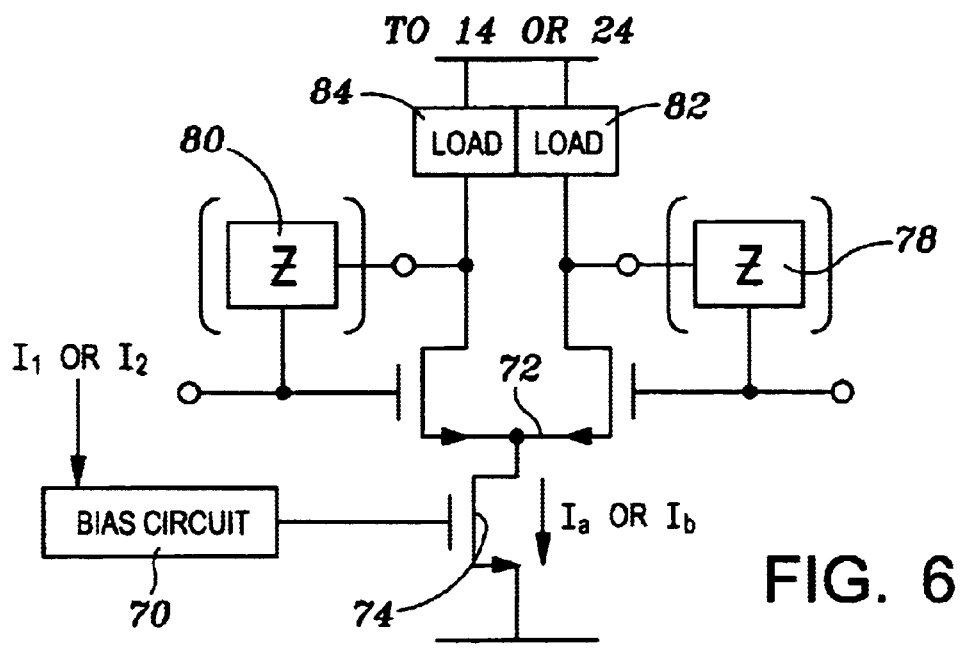
Figure 7:
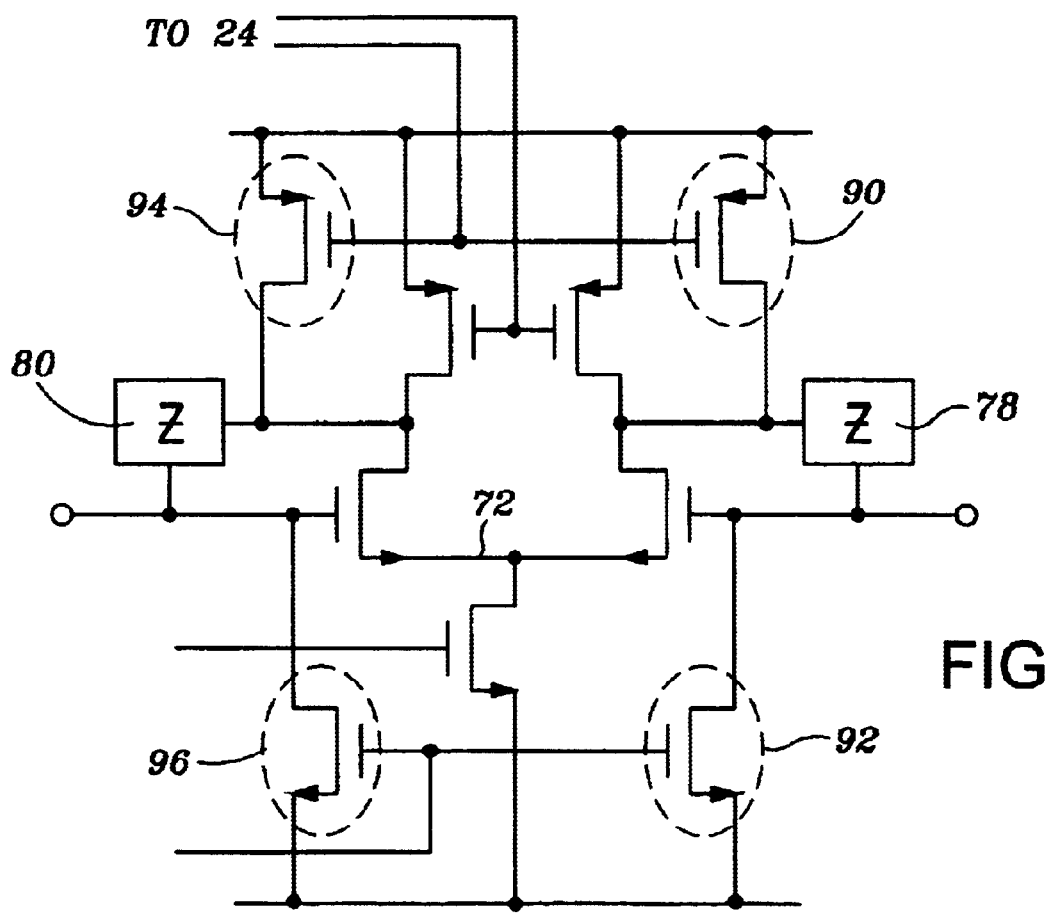

FIGS. 5, 6, and 7 illustrate various components which may be utilized in amplifiers 14 and 24. Each load of the amplifier elements in each amplifier 14 or 24 is an active load including transistors 64 and 66 (FIG. 5). The currents $1_a$ and $1_b$ generate a bias voltage for the active load represented by transistors 64 and 66.

FIG. 6 illustrates amplifiers 14 and 24 having a bias circuit 70, a differential pair of two or more transistors 72, a transistor 74 which provides a constant current source and which provides a bias current for the differential pair 72 and impedance elements 78 and 80, and loads 82 and 84 for differential pair 72. Transistors 72 and 74 may comprise, for example, field effect transistors or a bipolar transistor. Impedance elements 78 and 80 are connected respectively between a positive input and a negative output and between a negative input and a positive output of the differential pair 72. Bias circuit 70 converts the current generated by current output circuits 44 and 46 to bias voltages and feeds this bias voltage to gate or bases of the transistor 74 for constant current and active loads.

FIG. 7 illustrates an embodiment of circuitry for amplifier 24 having active loads in which impedance elements 78 and 80 are connected to field effect transistors or bipolar transistors 90 and 92, and 94 and 96, respectively, in order to flow constant current through impedance elements 78 and 80.

Other alteration and modification of the invention will likewise become apparent to those of ordinary skill in the art upon reading the present disclosure, and it is intended that the scope of the invention disclosed herein be limited only by the broadest interpretation of the appended claims to which the inventor is legally entitled.

I claim:

1. A variable gain amplifier comprising:

a voltage divider input stage for receiving a signal to be amplified;

a first voltage amplifier connected in cascade with said voltage divider input stage for amplifying said signal to be amplified;

said voltage divider input stage including a variable impedance circuit having a second voltage amplifier, said second voltage amplifier having an input and an output, and a first impedance element connected between said second voltage amplifier input and output;

said voltage divider input stage connected in series to a second impedance element; and each of said voltage amplifiers having a gain controlled by a bias current source.

2. The variable gain amplifier of claim 1 wherein said amplifiers each include field effect transistors.

3. The variable gain amplifier of claim 1 wherein said bias current sources each include:

first and second current sources;

a variable resistor connected between said first and second current sources;

a voltage feeding circuit connected to said variable resistor for applying a constant voltage; and first and second current output circuits for generating first and second output currents.

4. The variable gain amplifier of claim 3 wherein said voltage feeding circuit includes an operational amplifier connected to a field effect transistor.

5. The variable gain amplifier of claim 3 wherein said voltage feeding circuit includes an operational amplifier connected to a bipolar transistor.

6. The variable gain amplifier of claim 3 wherein said current output circuits each include an operational amplifier connected to a field effect transistor.

7. The variable gain amplifier of claim 3 wherein said current output circuits each include an operational amplifier connected to a bipolar transistor.

8. The variable gain amplifier of claim 3 wherein said variable resistor includes a temperature and process variation compensation circuit.

9. The variable gain amplifier of claim 8 wherein said compensation circuit includes a constant current source in series with a resistor and an estimating circuit connected to said resistor for measuring resistance fluctuations of said resistor by comparing a voltage drop across said resistor with a reference value.

10. The variable gain amplifier of claim 9 wherein said compensation circuit constant current source generates a current having a temperature coefficient having an absolute value but opposite in sign as a temperature coefficient of said resistor.

11. The variable gain amplifier of claim 3 wherein said bias current applied to said first and second amplifiers is proportional to said first and second output currents generated by said first and second current output circuits, respectively.

12. The variable gain amplifier of claim 1 wherein said first and second amplifiers each include a load having a transistor such that said bias current sources create a bias voltage for said load.

13. The variable gain amplifier of claim 12 wherein each load includes a differential pair of transistors.

14. The variable gain amplifier of claim 1 wherein said first and second amplifiers each include a differential pair of transistors, a constant current source for providing a bias current for said differential pair of transistors and an impedance element as a load for said differential pair of transistors.

15. The variable gain amplifier of claim 14 wherein said first amplifier includes active loads.

16. The variable gain amplifier of claim 1 wherein said impedance element includes an impedance element from a preceding circuit.

* * * * *

UNITED STATES PATENT AND TRADEMARK OFFICE
CERTIFICATE OF CORRECTION

PATENT NO. : 6,750,713 B1
DATED : June 15, 2004
INVENTOR(S) : Adam S. Wyszynski

It is certified that error appears in the above-identified patent and that said Letters Patent is hereby corrected as shown below:

Column 1,
Line 13, replace "Is" with -- is --.
Line 37, replace "receivers" with -- receiver's --.
Line 38, replace "transmitters" with -- transmitter's --.

Column 2,
Line 46, replace "Into" with -- into --.
Line 54, replace "amplifier. 10" with -- amplifier 10 --.

Column 3,
Line 4, replace "11 and 12" with -- $1_1$ and $1_2$ --.

Signed and Sealed this

Twenty-second Day of November, 2005

JON W. DUDAS
*Director of the United States Patent and Trademark Office*